United States Patent
Osada et al.

(10) Patent No.: US 11,367,475 B2
(45) Date of Patent: Jun. 21, 2022

(54) MAGNETIC STORAGE DEVICE

(71) Applicant: KIOXIA CORPORATION, Tokyo (JP)

(72) Inventors: Yoshiaki Osada, Tokyo (JP); Kosuke Hatsuda, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/189,240

(22) Filed: Mar. 1, 2021

(65) Prior Publication Data
US 2022/0084576 A1    Mar. 17, 2022

(30) Foreign Application Priority Data

Sep. 11, 2020  (JP) .............................. JP2020-152702

(51) Int. Cl.
*G11C 11/16* (2006.01)

(52) U.S. Cl.
CPC ...... *G11C 11/1697* (2013.01); *G11C 11/1659* (2013.01); *G11C 11/1673* (2013.01); *G11C 11/1675* (2013.01); *G11C 11/161* (2013.01)

(58) Field of Classification Search
CPC ............ G11C 11/1697; G11C 11/1659; G11C 11/1673; G11C 11/1675; G11C 11/161
See application file for complete search history.

(56) References Cited

U.S. PATENT DOCUMENTS

| | | | |
|---|---|---|---|
| 5,825,063 A | 10/1998 | Diorio et al. | |
| 5,914,894 A | 6/1999 | Diorio et al. | |
| 8,792,266 B2 | 7/2014 | Takashima | |
| 9,093,165 B2* | 7/2015 | Fifield | H03K 19/096 |
| 2006/0081962 A1 | 4/2006 | Wei et al. | |

FOREIGN PATENT DOCUMENTS

| | | |
|---|---|---|
| JP | 2006120702 A | 5/2006 |
| JP | 5713942 B2 | 12/2006 |
| JP | 2006339395 A | 12/2006 |

* cited by examiner

*Primary Examiner* — Sultana Begum
(74) *Attorney, Agent, or Firm* — Kim & Stewart LLP

(57) ABSTRACT

According to one embodiment, a magnetic storage device includes a magnetoresistive element having a first end and a second end. A first switch is between the first end and a first wiring. A second switch is between the second end and a second wiring. A third switch is between the first end and a third wiring. A fourth switch is between the second end and a fourth wiring. A driver is connected to the first wiring and the second wiring and is configured to supply, to the first wiring, a current at a magnitude set based on a voltage at the first end and a voltage at the second end.

20 Claims, 12 Drawing Sheets

MAGNETIC STORAGE DEVICE

CROSS-REFERENCE TO RELATED APPLICATION

This application is based upon and claims the benefit of priority from Japanese Patent Application No. 2020-152702, filed Sep. 11, 2020, the entire contents of which are incorporated herein by reference.

FIELD

Embodiments described herein relate generally to a magnetic storage device.

BACKGROUND

A storage device using a magnetoresistive element is known.

DETAILED DESCRIPTION

Embodiments provide a magnetic storage device capable of curbing both memory cell destruction and data writing errors.

In general, according to one embodiment, a magnetic storage device according to an embodiment includes a magnetoresistive element having a first end and a second end, a first switch between the first end and a first wiring, a second switch between the second end and a second wiring, a third switch between the first end and a third wiring, and a fourth switch between the second end and a fourth wiring. A driver is connected to the first wiring and the second wiring and is configured to supply, to the first wiring, a current with a magnitude set based on a voltage at the first end and a voltage at the second end.

Hereinafter, example embodiments will be described with reference to the drawings. In the following description, the same reference symbols will be applied to elements having substantially the same functions and configurations, and repeated description of such elements may be omitted. There may be cases in which additional numbers or letters are added to ends of reference symbols in order to particularly distinguish different instances from a plurality of elements having substantially the same functions and configurations from each other.

The drawings are schematic, and elements or aspects may be depicted with different dimensional relationships and ratios across different drawings. Furthermore, all descriptions for any one example embodiment may also be applied as description for other example embodiments unless explicitly or clearly excluded.

In the specification, a statement that a first element is "connected" to second element means that the first element can be directly connected to the second element but also includes an electrical connection between such elements made by a conductive element or elements. Furthermore, such connection via a conductive element may be constant (such as with a wire) or via a switch-like element that may be either in an on state or an off-state at different points in time.

In general, the example embodiments will be described using an xyz orthogonal coordinate system for descriptive convenience. Such a coordinate system is not a limitation. In the following description, descriptive terms "lower" and the like indicate a relational a position closer to a z axis as compared to another element or element(s), and descriptive terms "upper" and the like, similarly indicate a position farther from the z axis as compared to another element or element(s).

1. First Embodiment

1.1. Structure (Configuration)
1.1.1. Overall Structure

Figure 1:
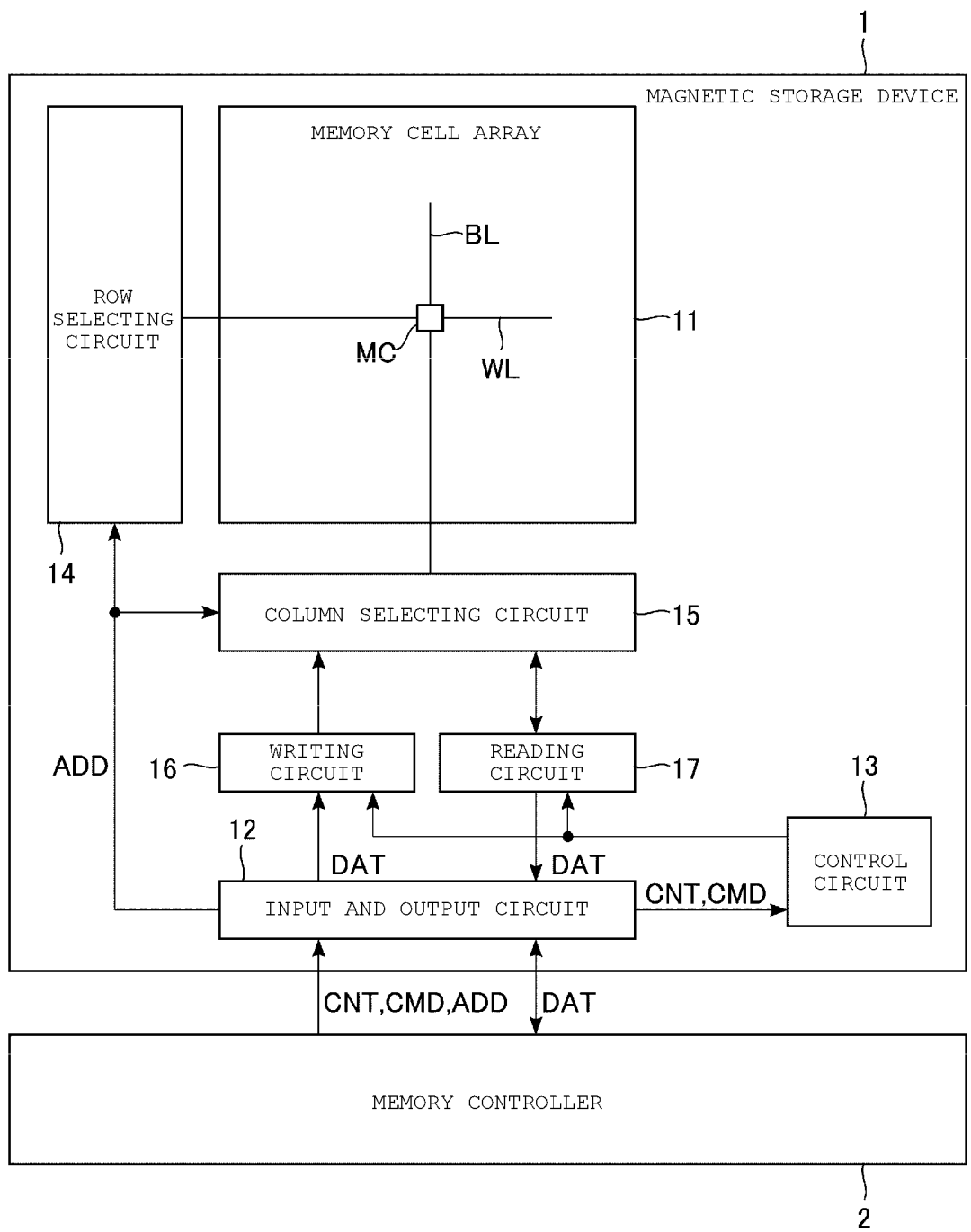
FIG. 1 illustrates a block diagram of a magnetic storage device according to a first embodiment.

FIG. 1 illustrates a block diagram of a magnetic storage device according to a first embodiment. As illustrated in FIG. 1, a magnetic storage device 1 includes a memory cell array 11, an input and output circuit 12, a control circuit 13, a row selecting circuit 14, a column selecting circuit 15, a writing circuit 16, and a reading circuit 17.

The memory cell array 11 includes a plurality of memory cells MC, a plurality of word lines WL, and a plurality of bit lines BL. The memory cells MC can store data in a nonvolatile manner. Each of the memory cells MC is connected to one word line WL and one bit line BL. The word lines WL are associated with rows. The bit lines BL are associated with columns. One or a plurality of memory cells MC are specified by selecting one row and one or a plurality of columns.

The input and output circuit 12 receives various control signals CNT, various commands CMD, an address signal ADD, and data (written data) DAT from a memory controller 2, for example, and transmits data (read data) DAT to the memory controller 2, for example.

The row selecting circuit 14 receives the address signal ADD from the input and output circuit 12 and brings about a state in which one word line WL associated with a row specified by the received address signal ADD is selected.

The column selecting circuit 15 receives an address signal ADD from the input and output circuit 12 and brings about a state in which a plurality of bit lines BL associated with a column specified by the received address signal ADD is selected.

The control circuit 13 receives a control signal CNT and a command CMD from the input and output circuit 12. The control circuit 13 controls the writing circuit 16 and the reading circuit 17 based on control indicated by the control signal CNT and the command CMD. Specifically, the control circuit 13 supplies, to the writing circuit 16, a voltage used to write data during data writing in the memory cell array 11. Also, the control circuit 13 supplies a voltage used to read data to the reading circuit 17 during data reading from the memory cell array 11.

The writing circuit 16 receives written data DAT from the input and output circuit 12 and supplies the voltage used to write data to the column selecting circuit 15 based on the control performed by the control circuit 13 and the written data DAT.

The reading circuit 17 includes a sense amplifier and figures out data stored in the memory cell MC using the voltage used to read data, based on control performed by the control circuit 13. The data figured out is supplied as read data DAT to the input and output circuit 12.

1.1.2. Circuit Configuration of Memory Cell Array

Figure 2:
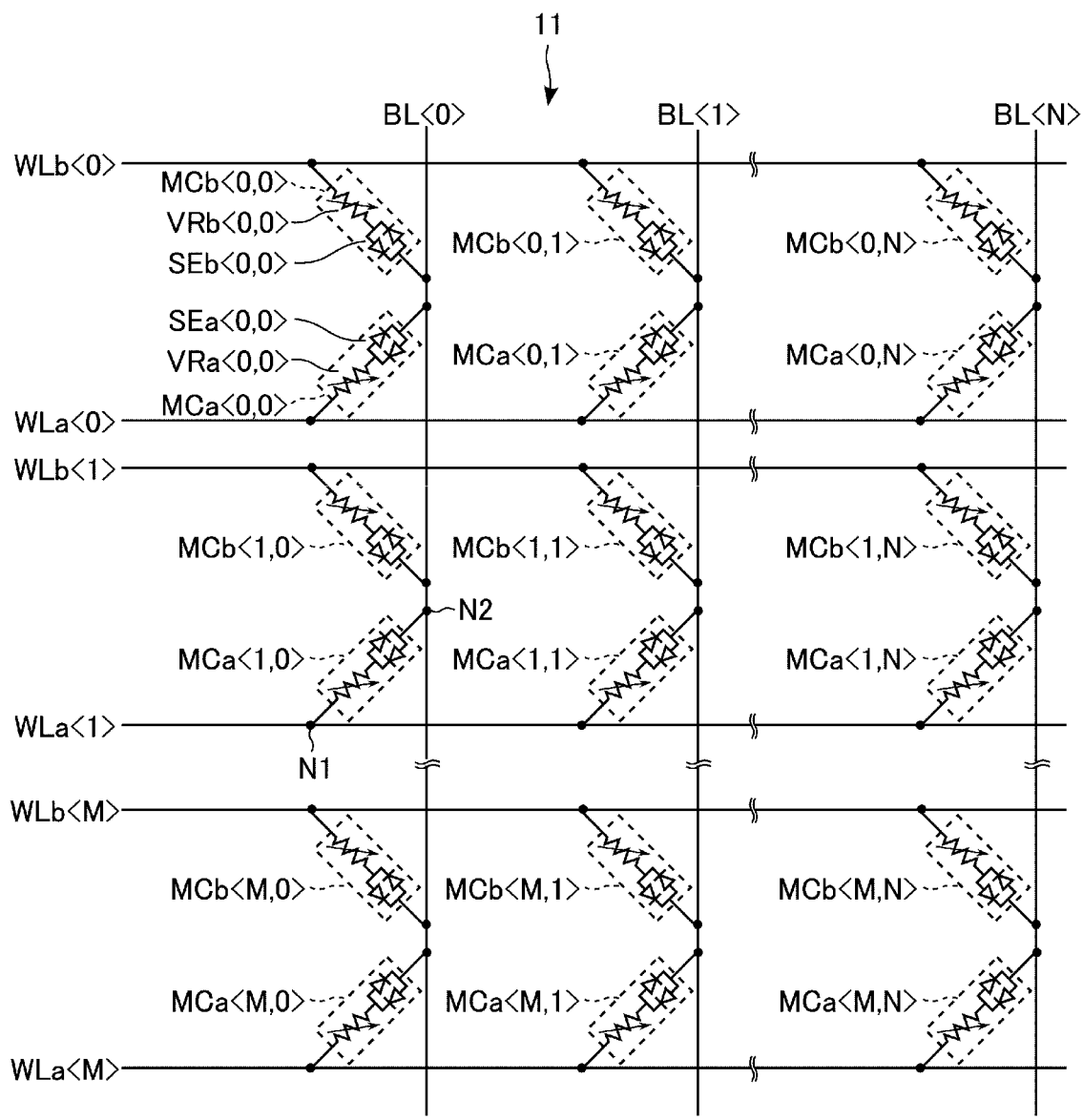
FIG. 2 is a circuit diagram of a memory cell array according to a first embodiment.

FIG. 2 is a circuit diagram of the memory cell array 11 according to the first embodiment. As illustrated in FIG. 2, the memory cell array 11 includes M+1 (M is a natural number) word lines WLa (WLa<0>, WLa<1> . . . WLa<M>) and M+1 word lines WLb (WLb<0>, WLb<1> . . . WLb<M>). The memory cell array 11 also includes N+1 (N is a natural number) bit lines BL (BL<0>, BL<1> . . . BL<N>).

Each of the memory cells MC (MCa and MCb) has two nodes, is connected to one word line WL at a first node N1, and is connected to one bit line BL at a second node N2. More specifically, the memory cell MCa includes a memory cell MCa<α, β> for all combinations of all cases in which α is an integer of equal to or greater than 0 and equal to or less than M and all cases in which β is an integer of equal to or greater than 0 and equal to or less than N, and the memory cell MCa<α, β> is connected between the word line WLa<α> and the bit line BL<β>. Similarly, the memory cell MCb includes memory cell Mcb<α, β> for all combinations of all cases in which α is an integer of equal to or greater than 0 and equal to or less than M and all cases in which β is an integer of equal to or greater than 0 and equal to or less than N, and the memory cell MCb<α, β> is connected between the word line WLb<α> and the bit line BL<β>.

Each of the memory cells MC includes one magnetoresistive element VR (VRa or VRb) and one switching element SE (SEa or SEb). More specifically, the memory cell MCa<α, β> includes a magnetoresistive element VRa<α, β> and a switching element SEa<α, β> for all combinations of all cases in which α is an integer of equal to or greater than 0 and equal to or less than M and all cases in which β is an integer of equal to or greater than 0 and equal to or less than N. Further, the memory cell MCb<α, β> includes a magnetoresistive element VRb<α, β> and a switching element SEb<α, β> for all combinations of all cases in which α is equal to or greater than 0 and equal to or less than M and all cases in which β is an integer of equal to or greater than 0 and equal to or less than N.

In each memory cell MC, the magnetoresistive element VR and the switching element SE are connected in series. The magnetoresistive element VR is connected to one word line WL, and the switching element SE is connected to one bit line BL.

The magnetoresistive element VR can be switched between a state in which the magnetoresistive element VR has a low resistance Ra and a state in which the magnetoresistive element VR has a high resistance Rap. The magnetoresistive element CR can store 1-bit data using the difference between the two resistance states.

The switching element SE has two terminals. When a voltage that is less than a first threshold value is applied between the two terminals in a first direction, the switching element SE is in a high resistance state, for example, an electrically non-conductive state (also referred to as being in an off state). On the other hand, when a voltage that is equal to or greater than the first threshold value is applied between the two terminals in the first direction, the switching element SE is in a low resistance state, for example, an electrically conductive state (also referred to as being in an on state). The switching element can switch between the high resistance state and the low resistance state based on the magnitude of the voltage applied in the first direction, or similarly switch state based on the magnitude of the voltage applied in a second direction opposite to the first direction as well. It is possible to control whether or not to supply a current to the magnetoresistive element VR connected to the switching element SE, that is, whether or not to select the magnetoresistive element VR, by turning on or off the switching element SE.

1.1.3. Structure of Memory Cell Array

Figure 3:
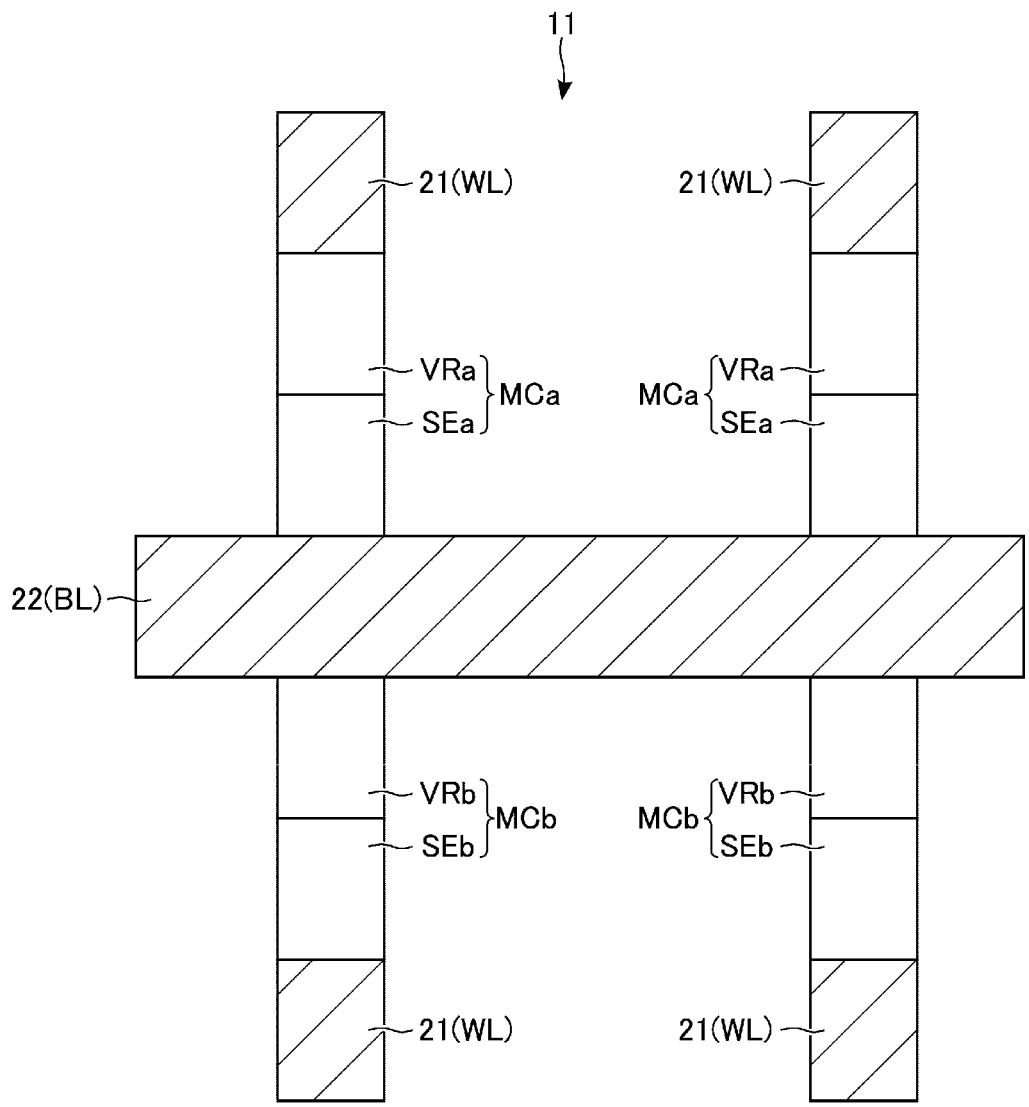
FIG. 3 depicts a part of a memory cell array according to a first embodiment.
Figure 4:
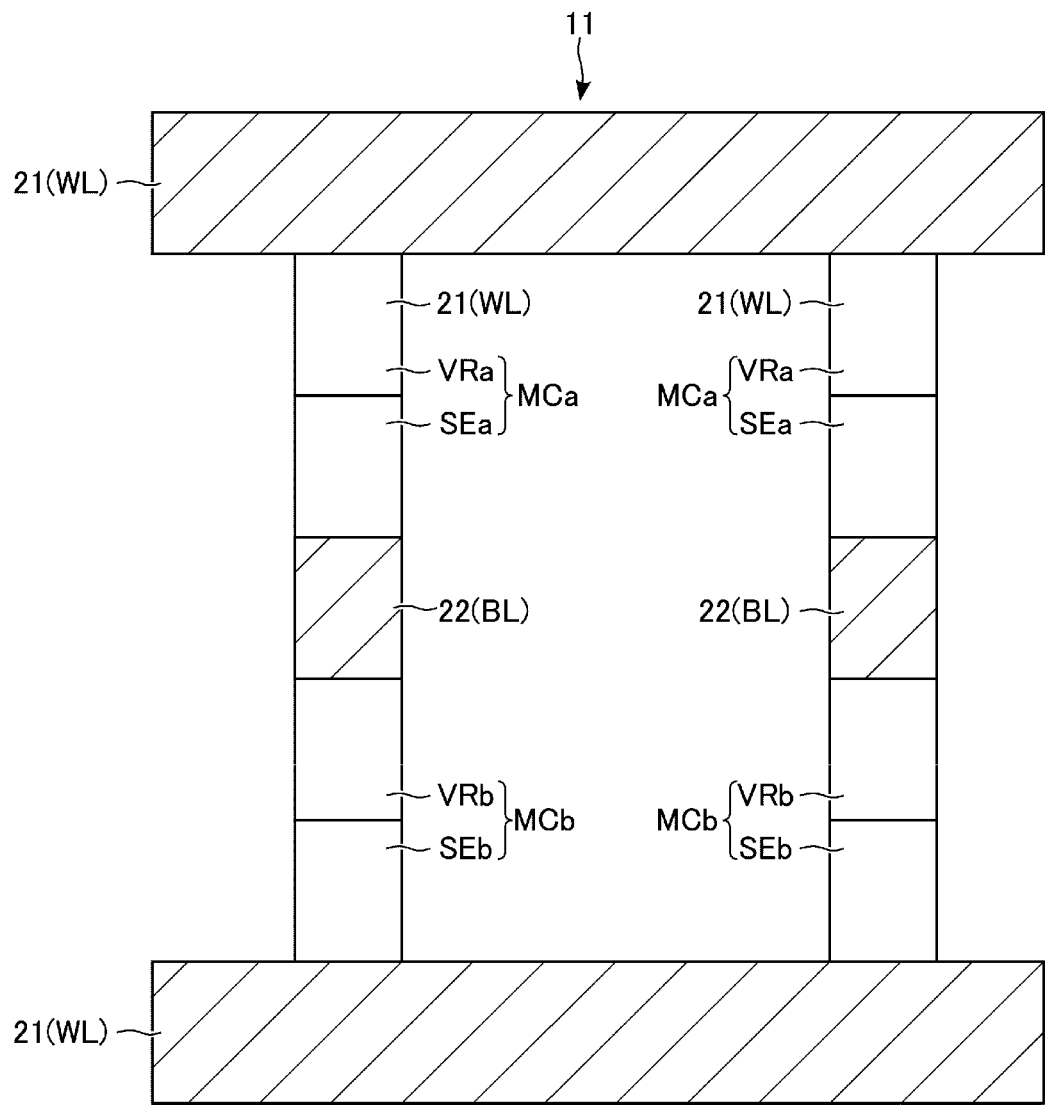
FIG. 4 depicts a part of a memory cell array according to a first embodiment.

FIGS. 3 and 4 illustrate a structure of a part of a section of the memory cell array 11 according to the first embodiment. FIG. 3 illustrates a section along the xz plane, and FIG. 4 illustrates a section along the yz plane.

As illustrated in FIGS. 3 and 4, a plurality of conductors 21 are stacked above a semiconductor substrate. The conductors 21 extend along the y axis and are arranged with respect to one another along the x axis. Each conductor 21 functions as a word line WL.

Each conductor 21 has an upper surface connected to bottom surfaces of the plurality of memory cells MCb. Each memory cell MCb has a circular shape, for example, in the xy plane. The memory cells MCb are aligned along the y axis on each conductor 21, and through such disposition, the memory cells MCb are arranged in a matrix pattern in the xy plane. Each memory cell MCb includes a structure that functions as the switching element SEb and a structure that functions as the magnetoresistive element VRb. Each of the switching element SEb and the magnetoresistive element VRb comprises one layer or a plurality of layers.

A plurality of conductors 22 are provided above the memory cell MCb. The conductors 22 extend along the x axis and are arranged with respect to one another along the y axis. Each conductor 22 has a bottom surface that is in contact with upper surfaces of memory cells MCb aligned with each other along the x axis. Each conductor 22 functions as a bit line BL.

Each conductor 22 has an upper surface connected to bottom surfaces of memory cells MCa. Each memory cell MCa has a circular shape, for example, in the xy plane. Memory cells MCa are aligned with other memory cells MCa along the x axis on each conductor 22, and through such disposition, the memory cells MCa are disposed in a matrix pattern in the xy plane. Each memory cell MCa has a structure that functions as the switching element SEa and a structure that functions as the magnetoresistive element VRa. The switching element SEa and the magnetoresistive element VRa each comprise one layer or a plurality of layers.

Additional conductors 21 can be on upper surfaces of memory cells MCa aligned with each other along the y axis.

It is also possible to realize the memory cell array 11 as illustrated in FIG. 2 by the structures from the lowermost layer of the conductors 21 to the layer of the memory cells MCa illustrated in FIGS. 3 and 4 being repeatedly provided along the z axis.

The memory cell array 11 further includes an interlayer insulator in the region (s) where the conductors 21, the conductors 22, and the memory cells MC are not provided.

Figure 5:
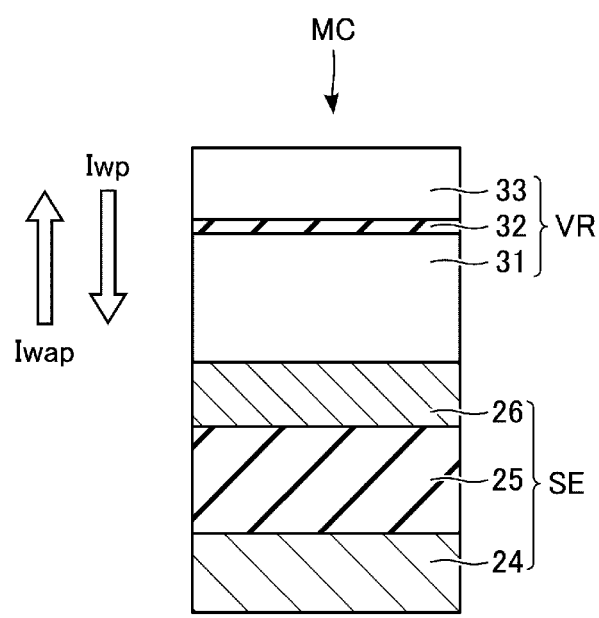
FIG. 5 depicts a structure of a memory cell according to a first embodiment.

FIG. 5 illustrates a representative section of the structure of a memory cell MC according to the first embodiment. As illustrated in FIG. 5, the switching element SE includes a lower electrode 24, a variable resistance material 25 formed as a layer in this example, and an upper electrode 26. The lower electrode 24 is located on the upper surface of the conductor 21 or 22. The variable resistance material 25 is located on the upper surface of the lower electrode 24. The upper electrode 26 is located on the upper surface of the variable resistance material 25.

The lower electrode 24 and the upper electrode 26 contains or is made of titanium nitride (TiN), for example.

The variable resistance material 25 is, for example, a switch-like element between two terminals, and a first terminal of the switch-like element is one of an upper surface or a bottom surface of the variable resistance material 25 while a second terminal is the other one of the upper surface and the bottom surface of the variable resistance material 25. One magnetoresistive element VR is located on the upper surface of each upper electrode 26. The magnetoresistive element VR in the present embodiment shows a tunnel magnetoresistive effect, and a case of a magnetic tunnel junction (MTJ) element will be described as one example. Specifically, the magnetoresistive element VR includes a ferromagnetic layer 31, an insulating layer 32, and a ferromagnetic layer 33. In an example, the insulating layer 32 is located on the upper surface of the ferromagnetic layer 31, and the ferromagnetic layer 33 is located on the upper surface of the insulating layer 32, as illustrated in FIG. 5.

The ferromagnetic layer 31 has an axis of easy magnetization in a direction penetrating through interfaces of the ferromagnetic layer 31, the insulating layer 32, and the ferromagnetic layer 33, for example, an axis of easy magnetization at an angle of equal to or greater than 45° and equal to or less than 90° with respect to the interfaces, and for example, an axis of easy magnetization in a direction that perpendicularly intersects the interfaces. The orientation of the magnetization in the ferromagnetic layer 31 is intended to be invariant even when data is read from and written in the magnetic storage device 1. The ferromagnetic layer 31 can function as a so-called reference layer. The ferromagnetic layer 31 may comprise a plurality of stacked ferromagnetic layers and/or conductive layers.

The insulating layer 32 contains or is made of magnesium oxide (MgO), for example, and functions as a so-called tunnel barrier.

The ferromagnetic layer 33 contains or is made of cobalt iron boron (CoFeB) or boronized iron (FeB), for example. The ferromagnetic layer 33 has an axis of easy magnetization in a direction penetrating through interfaces of the ferromagnetic layer 31, the insulating layer 32, and the ferromagnetic layer 33, for example, an axis of easy magnetization at an angle of equal to or greater than 45° and equal to or less than 90° with respect to the interfaces, and for example, an axis of easy magnetization in a direction that perpendicularly intersects the interfaces. The orientation of the magnetization in the ferromagnetic layer varies according to the data being written, and the ferromagnetic layer 33 can function as a so-called storage layer.

If the orientation of the magnetization in the ferromagnetic layer 33 is parallel to the orientation of the magnetization in the ferromagnetic layer 31, the magnetoresistive element VR has a low resistance value. If the orientation of the magnetization in the ferromagnetic layer 33 is antiparallel to the orientation of magnetization in the ferromagnetic layer 31, the magnetoresistive element VR has a higher resistance value than the resistance when the orientations of the magnetization in the ferromagnetic layers 31 and 33 are parallel to each other. A memory cell MC in a state in which the orientation of the magnetization in the ferromagnetic layer 33 is parallel to the orientation of the magnetization in the ferromagnetic layer 31 is referred to as being in a "P state". A memory cell MC in a state in which the orientation of the magnetization in the ferromagnetic layer 33 is antiparallel to the orientation of the magnetization in the ferromagnetic layer 31 is referred to as being in an "AP state".

If a writing current Iwp of a certain magnitude flows from the ferromagnetic layer 33 toward the ferromagnetic layer 31, then the orientation of the magnetization in the ferromagnetic layer 33 becomes parallel to the orientation of the magnetization in the ferromagnetic layer 31. Such an operation of inverting the orientation of the magnetization may be referred to as "P writing". On the other hand, if a writing current Iwap of a certain magnitude flows from the ferromagnetic layer 31 toward the ferromagnetic layer 33, then the orientation of the magnetization in the ferromagnetic layer 33 becomes antiparallel to the orientation of the magnetization in the ferromagnetic layer 31. Such an operation of inverting the orientation of the magnetization may be referred to as "AP writing". The writing current Iwp may be referred to as a "P writing current," and the writing current Iwap may be referred to as an "AP writing current." The AP writing current Iwap is greater than the P writing current Iwp. The AP writing current Iwap and the P writing current Iwp may each be referred to as a writing current Iw in some instances. Therefore, the term writing current Iw means the P writing current in the case of a P writing to a selected memory cell MC and means an AP writing current Iwap in the case of an AP writing to the selected memory cell MC.

The memory cell MC may include additional conductors, insulators, and/or ferromagnets.

Figure 6:
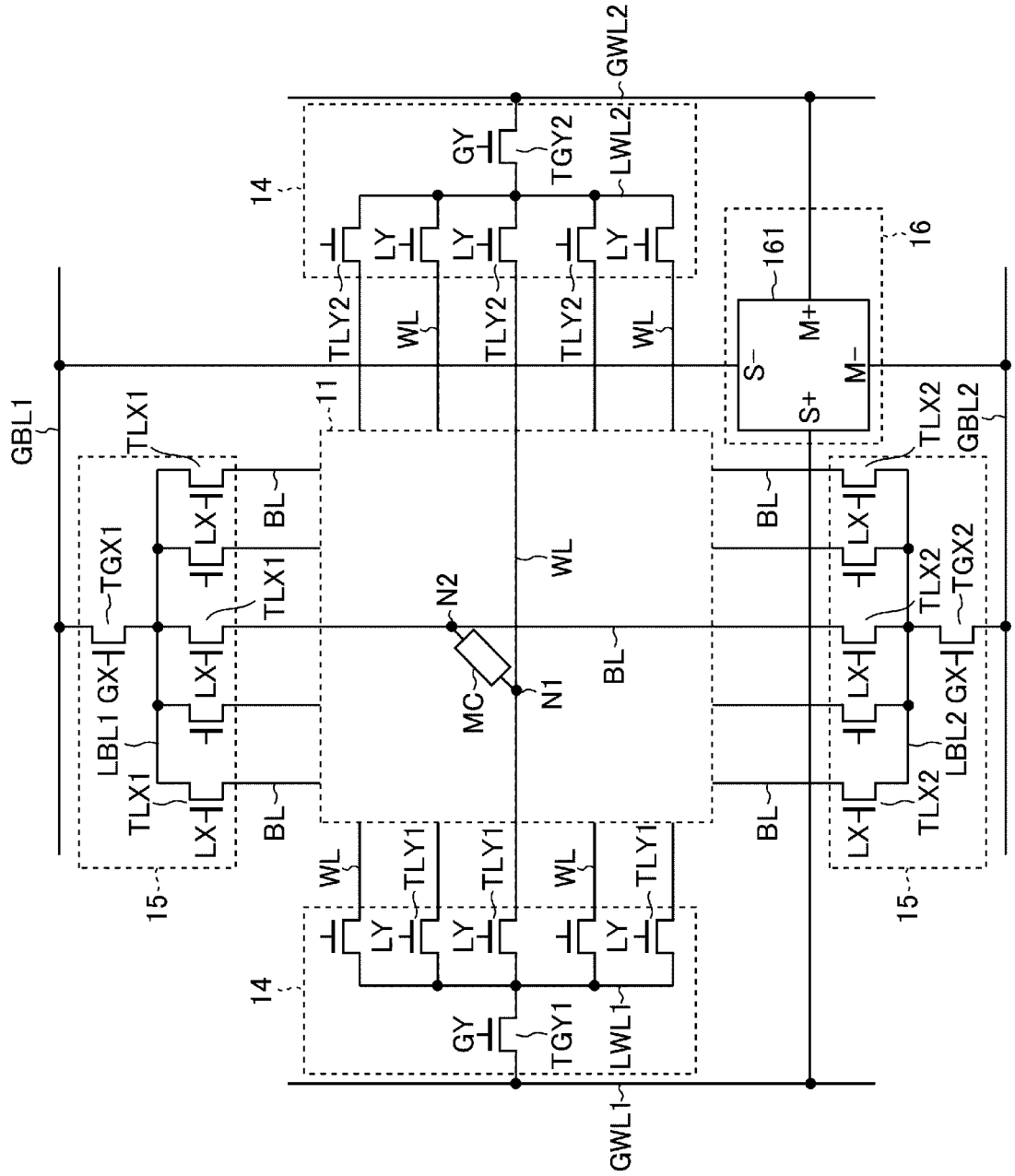
FIG. 6 depicts aspects of a magnetic storage device according to a first embodiment.

FIG. 6 illustrates details of some portions of the magnetic storage device 1 according to the first embodiment. More specifically, FIG. 6 illustrates elements, connections, and general layout of the memory cell array 11, the row selecting circuit 14, the column selecting circuit 15, and the writing circuit 16. FIG. 6 illustrates, as a representative of the others, only one memory cell MC among the plurality of memory cells MC.

As illustrated in FIG. 6, and as described with reference to FIG. 2, the memory cell MC is connected, at the first node N1, to one word line WL and is connected, at the second node N2, to one bit line BL. When the memory cell MC is a memory cell MCa type, the word line WL connected to the memory cell MC is a word line WLa. On the other hand, when the memory cell MC is a memory cell MCb type, the word line WL connected to the memory cell MC is a word line WLb.

The row selecting circuit 14 includes a plurality of local row switches TLY1, a plurality of local row switches TLY2, a global row switch TGY1, and a global row switch TLY2. Each word line WL is connected, its first end, to the first end of one local row switch TLY1. The word lines WL are connected to the first ends of the local row switches TLY1 on the same side, and for example, are connected to the first ends of the local row switches TLY1 on a smaller coordinate side along the y axis in the structure in FIG. 4, that is, at the end on the left side.

Each local row switch TLY1 receives, at a control terminal, a control signal LY from another element in the row selecting circuit 14 and is turned on or off based on the control signal LY. Each local row switch TLY1 may be an n-type metal oxide semiconductor field effect transistor (MOSFET) and receives, at a gate terminal, the control signal LY. The row selecting circuit 14 brings only the control signal LY to be supplied to one local row switch TLY1 designated by the address signal from among the plurality of local row switches TLY1 to a level (a high level, for example) by which selection is designated/indicated. As a result, only the local row switch TLY1 that receives the control signal LY at the selection designating level is then turned on from among the plurality of local row switches TLY1.

The second end (the other end) of each local row switch TLY1 is connected to a local word line LWL1. By one of the plurality of local row switches TLY1 being turned on, the word line WL connected to the local row switch TLY1 is connected to the local word line LWL1 via the local row switch TLY1 that has been turned on.

The local word line LWL1 is connected to a global word line GWL1 via a global row switch TGY1. The global row switch TGY1 receives, at a control terminal, a control signal GY from another element in the row selecting circuit 14 and is turned on or off based on this control signal GY. The global row switch TGY1 may be an n-type MOSFET and receives, at a gate terminal, the control signal GY.

Each word line WL is connected at its second end (the other end) to the first end (one end) of one local row switch TLY2. The word lines WL are connected to the first ends of the local row switches TLY2 on the same side, and for example, are connected to the first ends of the local row switches TLY2 on a larger coordinate side along the y axis in the structure in FIG. 4, that is, at the end on the right side.

Each local row switch TLY2 receives, at the control terminal, a control signal LY from another element in the row selecting circuit 14 and is turned on or off based on the control signal LY. Each local row switch TLY2 may be an n-type MOSFET and receives, at a gate terminal, the control signal LY. The row selecting circuit 14 brings only the control signal LY to be supplied to one local row switch TLY2 designated by the address signal ADD from among the plurality of local row switches TLY2 to the selection designating level (a high level, for example). As a result, only the local row switch TLY2 that receives the selection designating control signal LY is then turned on from among the plurality of local row switches TLY2.

The second end (other end) of each local row switch TLY2 is connected to a local word line LWL2. By one of the plurality of local row switches TLY2 being turned on, the word line WL connected to the local row switch TLY2 is connected to the local word line LWL2 via the local row switch TLY2.

A pair of local row switches TLY1 and TLY2 connected to the same word line WL receive, at each of the gates thereof, the same control signal LY. By the control signal LY associated with a certain word line WL being brought into the level by which selection is designated, the word line WL is connected to both the local word lines LWL1 and LWL2.

The local word line LWL2 is connected to a global word line LWL2 via the global row switch TGY2. The global row switch TGY2 receives, at a control terminal, the control signal GY from another element in the row selecting circuit 14 and is turned on or off based on the control signal GY. The global row switch TGY2 may be an n-type MOSFET and receives, at a gate terminal, the control signal GY.

The column selecting circuit 15 includes a plurality of local column switches TLX1, a plurality of local column switches TLX2, a global column switch TGX1 and a global column switch TLX2. Each bit line BL is connected to the first end (one end) of one local column switch TLX1 at one end (first end). The bit lines BL are connected to the first ends of the local column switches TXL1 on the same side, and for example, are connected to the first ends of the local column switches TLX1 on a smaller coordinate side along the y axis in the structure in FIG. 3, that is, at the end on the left side.

Each local column switch TLX1 receives, at a control terminal, the control signal LX from another element in the column selecting circuit 15 and is turned on or off based on the control signal LX. Each local column switch TLX1 may be an n-type MOSFET and receives, at a gate terminal, the control signal LX. The column selecting circuit 15 brings, into a level in which selection is designated (a high level, for example), only the control signal LX to be supplied to one local column switch TLX1 designated by the address signal ADD from among the plurality of local column switches TLX1. As a result, only the local column switch TLX1 that receives the control signal LX in the level in which selection is designated is then turned on from among the plurality of local column switches TLX1.

The second end (the other end) of each local column switch TLX1 is connected to a local bit line LBL1. By one of the plurality of local column switches TLX1 being turned on, the bit line BL connected to the local column switch TLX1 is connected to the local bit line LBL1 via the local column switch TLX1.

The local bit line LBL1 is connected to a global bit line GBL1 via the global column switch TGX1. The global column switch TGX1 receives, at a control terminal, a control signal GX from another element in the column selecting circuit 15 and is turned on or off based on the control signal GX. The global column switch TGX1 may be an n-type MOSFET and receives, at a gate terminal, the control signal GX.

Each bit line BL is connected to the first end (one end) of one local column switch TLX2 at the second end (the other end). The bit lines BL are connected to the first ends of the local column switches TLX2 on the same side, and for example, are connected to the first ends of the local column switches TLX2 on the larger coordinate side along the y axis in the structure in FIG. 3, that is, at the end on the right side.

Each local column switch TLX2 receives, at a control terminal, the control signal LX from another element in the column selecting circuit 15 and is turned on or off based on the control signal LX. Each local column switch TLX2 may be an n-type MOSFET and receives, at a gate terminal, the control signal LX. The column selecting circuit 15 brings, into a level in which selection is designated (a high level, for example), only the control signal LX to be supplied to one local column switch TLX2 designated by the address signal ADD from among the plurality of local column switches TLX2. As a result, only the local column switch TLX2 that receives the control signal LX in the level in which selection is designated is then turned on from among the plurality of local column switches TLX2.

The second end (the other end) of each local column switch TLX2 is connected to the local bit line LBL2. By one of the plurality of local column switches TLX2 being turned on, the bit line BL connected to the local column switch TLX2 is connected to the local bit line LBL2 via the local column switch TLX2.

A pair of local column switches TLX1 and TLX2 connected to the same bit line BL receive, at gates thereof, the same control signals LX. By the control signal LX associated with a certain bit line BL being brought into the level by which selection is designated, the bit line BL is connected to both the local bit lines LBL1 and LBL2.

The local bit line LBL2 is connected to a global bit line GBL2 via the global column switch TGX2. The global column switch TGX2 receives, at a control terminal, the control signal GX from another element in the column selecting circuit 15 and is turned on or off based on the control signal GX. The global column switch TGX2 may be an n-type MOSFET and receives, at a gate terminal, the control signal GX.

The writing circuit 16 includes a writing driver 161. The writing driver 161 is located outside the memory cell array 11. In an example, the writing driver 161 may be located on the side of the global word line GWL 2, the side of the second end of the word line WL, or the right side of the memory cell array 11. In an example, the writing driver 161 may be located on the side of the global bit line GBL2, the side of the second end of the bit line BL, or the lower side of the memory cell array 11.

The writing driver 161 has a first node S+, a second node S−, a third node M+, and a fourth node M−. The first node S+ is connected to the global word line GWL1. The second node S− is connected to the global bit line GBL1. The third node M+ is connected to the global word line GWL2. The fourth node M− is connected to the global bit line GBL2.

The writing driver 161 further receives, from the control circuit 13 or the like, a reference voltage Vref at one fixed magnitude that is, however, dynamically selected from a plurality of possible magnitudes. The writing driver 161 can output a current with variable magnitude from the first node S+. The writing driver 161 can draw a current at the second node S−. The writing driver 161 allows the current output from the first node S+ to flow to the second node S− via a conductive element by the conductive element being connected between the first node S+ and the second node S−. The current output from the first node S+ of the writing driver 161 may be referred to as an output current IO of the writing driver 161.

The writing driver 161 changes the magnitude of the output current IO on the basis of a voltage applied to the third node M+ and a voltage applied to the fourth node M−. Specifically, the writing driver 161 functions as a negative feedback circuit that outputs less output current IO as a difference between the voltage at the third node M+ and a voltage at the fourth node M− increases. The voltage at the third node M+ and the voltage at the fourth node M− can have various magnitudes. The writing driver 161 outputs, from the first node S+, the output current IO that enables a voltage with substantially the same magnitude as that of the reference voltage Vref to be applied to the memory cell MC that is a target for the data writing. The output current IO is set regardless of the magnitude of the voltage at the third node M+ and the magnitude of the voltage at the fourth node M−, but rather is based on the magnitude of the voltage at the third node M+ and the magnitude of the voltage at the fourth node M−.

The memory cell that is a target of data writing may be referred to as a selected memory cell MCS. In the present context, the expression "substantially the same" means that two or more aspects are in principle or ideally the same, but unintended errors or differences from ideality are also within the meaning of the expression. Therefore, when the writing driver 161 is said to output the output current IO that allows a voltage with substantially the same magnitude as that of the reference voltage Vref to be applied to the selected memory cell MCS, this means that the output current IO that is intended to allow a voltage with the same magnitude as that of the reference voltage Vref to be applied to the selected memory cell MCS is output by the writing driver 161, but differences may result in actual operations.

More specifically, the writing driver 161 outputs the output current IO with a magnitude adjusted such that a sum of the voltage at the fourth node M− and the reference voltage Vref is equal to the voltage at the third node M+. In order to enable such a negative feedback operation, the third node M+ and the fourth node M− are connected to the first node N1 and the second node N2 of the selected memory cell MCS, respectively.

Figure 7:
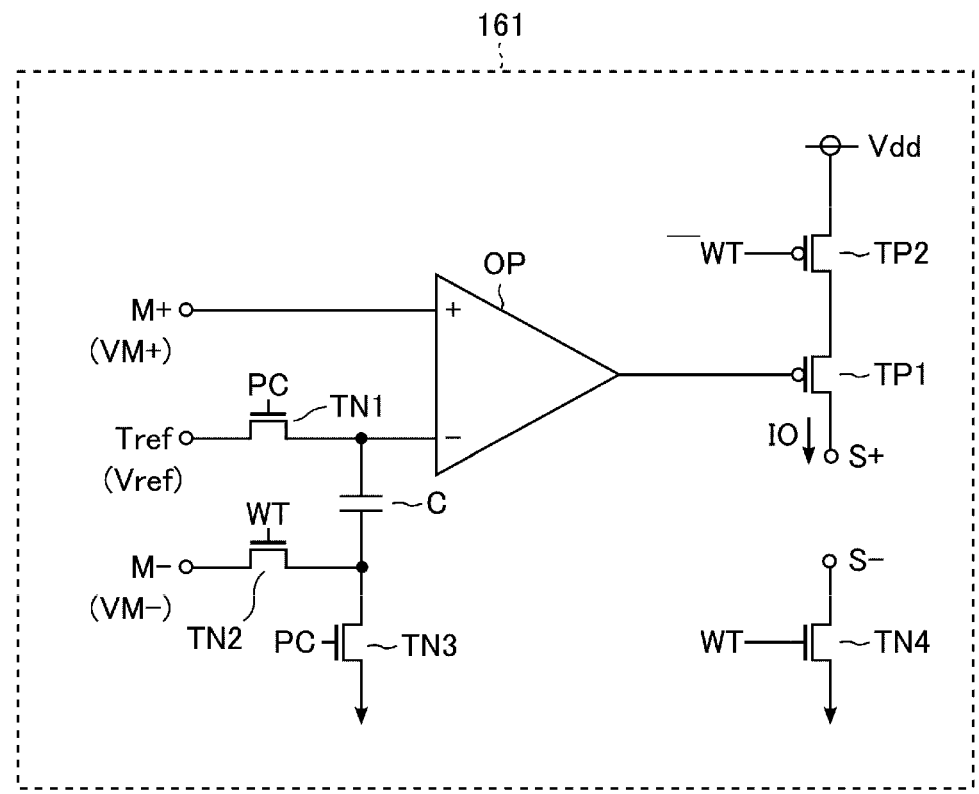
FIG. 7 depicts elements and connections of a writing driver according to a first embodiment.

FIG. 7 illustrates an example of elements and connection of the writing driver 161 according to the first embodiment. As illustrated in FIG. 7, the writing driver 161 includes an operational amplifier OP, a capacitance C (referred to as a capacitor C), and a p-type MOSFET TP1. The writing driver 161 may further include n-type MOSFETs TN1, TN2, TN3, and TN4 and a p-type MOSFET TP2 for the purpose of performing control such that the writing driver 161 is operated or non-operated.

A non-inverting input terminal of the operational amplifier functions as the third node M+ of the writing driver 161. The voltage at the node M+ will be referred to as a voltage VM+. The first end (one of a source and a drain) of a transistor TN1 functions as a node Tref and receives the reference voltage Vref. The second end (the other one of the source and the drain) of the transistor TN1 is connected to the inverting input terminal of the operational amplifier OP. A gate of the transistor TN1 receives a control signal PC from the control circuit 13, for example.

The reference voltage Vref has different magnitudes in the cases of AP writing and P writing. In the case of the AP writing, the reference voltage Vref has a magnitude that allows a voltage with the same magnitude as that of the reference voltage to be applied to the selected memory cell MCS and allows the AP writing current Iwap to flow through the selected memory cell MCS. The magnitude of the reference voltage Vref in the case of AP writing may be based on average properties of the memory cells MC. For example, the value may be set or selected in consideration of normal or expected variations in properties of the memory cells MC in the magnetic storage device 1, for example.

In a case of P writing, the reference voltage Vref has a magnitude that allows a voltage with the same magnitude as that of the reference voltage Vref to be applied to the selected memory cell MCS and allows the P writing current Iwp to flow through the selected memory cell MCS. The magnitude of the reference voltage Vref in the case of P writing may be based on average properties of the memory cells MC. For example, the value may be set or selected in consideration of normal or expected variations in properties of the memory cells MC in the magnetic storage device 1, for example.

The first end of a transistor TN2 functions as the fourth node M−. The voltage at the node M− will be referred to as a voltage VM−. The second end of the transistor TN2 is connected to the inverting input terminal of the operational amplifier OP via the capacitor C. A gate of the transistor TN2 receives a control signal WT from the control circuit 13, for example. The second end of the transistor TN2 is further connected to a node of a ground potential via a transistor TN3. A gate of the transistor TN3 receives the control signal PC from the control circuit 13, for example.

The first end of a transistor TP2 is connected to a node of a power potential Vdd. A gate of the transistor TP2 receives a control signal ⁻WT. The sign "⁻" denotes an inversion logic of a logic of the signal to which the sign "⁻" has been applied. The second end of the transistor TP2 is connected to the first end of a transistor TP1. A gate of the transistor TP1 is connected to an output terminal of the operational amplifier OP. The second end of the transistor TP1 functions as the first node S+ of the writing driver 161.

The first end of a transistor TN4 functions as the second node S− of the writing driver 161. The second end of the transistor TN4 is connected to a node of the ground potential.

The magnitude of the output current IO depends on the magnitude of a voltage applied to the gate of the transistor TP1. In other words, the operational amplifier OP outputs a smaller voltage, that is, applies a smaller voltage to the gate of the transistor TP1 as a difference between a voltage at the non-inverting input terminal and a voltage at the inverting input terminal increases. As the voltage applied to the gate of the transistor TP1 decreases, the magnitude of the output current IO increases. On the other hand, as the voltage applied to the gate of the transistor TP1 increases, the magnitude of the output current IO decreases.

The writing driver 161 is enabled and can operate when a high-level control signal WT is being received.

1.2. Operations

Figure 8:
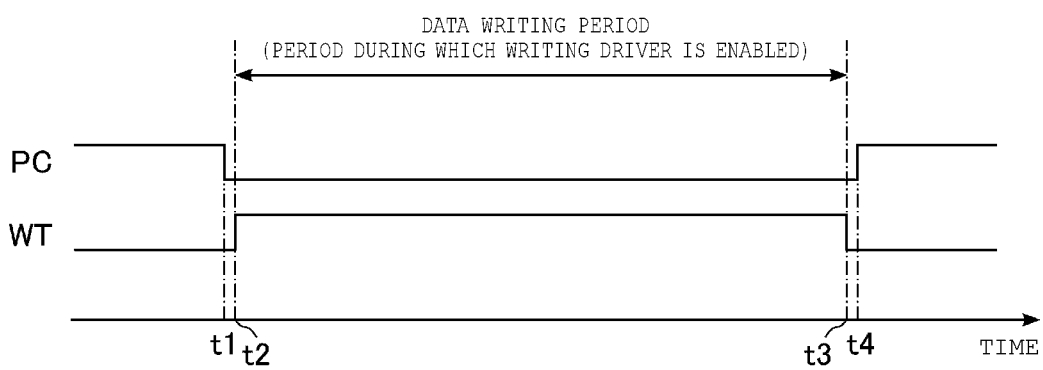
FIG. 8 depicts signal states during data writing in a magnetic storage device according to a first embodiment.

FIG. 8 illustrates some signal states during data writing in the magnetic storage device 1 with time according to the first embodiment.

As illustrated in FIG. 8, the control signal PC is in a high level while the control signal WT is in a low level before data writing is started. When the control signal WT is in a low level, the writing driver 161 is disabled. Since the control signal PC is in a high level, the transistors TN1 and TN3 illustrated in FIG. 7 are in an on state, and one (first end) of the terminals of the capacitor C connected to the transistor TN1 has the voltage Vref. The other one (second end) connected to the transistor TN3 has a ground potential (=0 [V]).

The control signal PC is turned into a low level at the clock time t1 with data writing. The low level of the control signal PC continues until the clock time t4. As a result of the shifting of the control signal PC to the low level, the transistors TN1 and TN3 illustrated in FIG. 7 are turned off, and the capacitor C is brought into an electrically floating state.

At the clock time t2, the control signal WT is turned into a high level. The control signal WT controls a writing period and is maintained in the high level during the writing. The high level of the control signal WT continues until the clock time t3. The writing driver 161 is enabled between the clock time t2 to the clock time t3. As a result of the shifting of the control signal WT to the high level, the transistor TN2 is turned on, and the voltage at the second end of the capacitor C is boosted from 0 to VM−. Since the capacitor C is floating, the voltage at the first end of the capacitor C is boosted by the same amount as that of the boosting of the voltage at the second end. In other words, the voltage at the first end of the capacitor C becomes Vref+VM−. Therefore, the voltage with the magnitude of Vref+VM− is applied to the inverting input terminal of the operational amplifier when the writing driver 161 is enabled.

The control signal WT is returned to the low level at the clock time t3, and the control signal PC is returned to the high level at the clock time t4.

Figure 9:
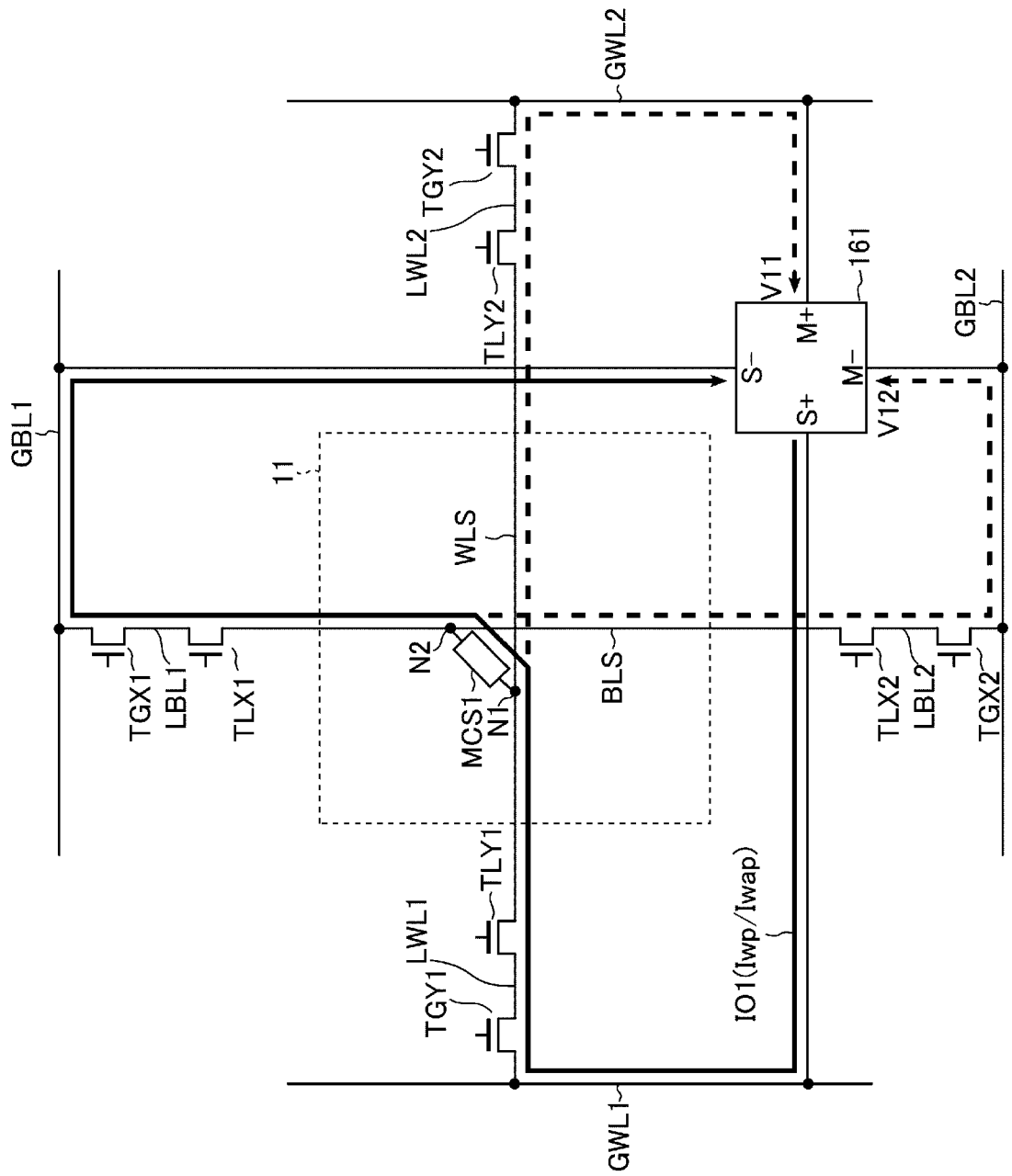
FIG. 9 depicts aspects related to data writing in a magnetic storage device according to a first embodiment.

FIG. 9 illustrates a state during data writing in the magnetic storage device 1 according to the first embodiment. FIG. 9 illustrates the same elements and range as those in FIG. 7 and also represents the layout similarly to FIG. 7. FIG. 9 illustrates a state during data writing in a certain selected memory cell MCS. The word line WL connected to the selected memory cell MCS will be referred to as a selected word line WLS. The bit line BL connected to the selected memory cell MCS will be referred to as a selected bit line BLS. FIG. 9 illustrates only switches that are turned on from among the switches TLY1, TGY1, TLY2, TGY2, TLX1, TGX1, TLX2, and TGX2. The switches which are not illustrated in FIG. 9 are turned off during data writing in the selected memory cell MCS.

The selected memory cell MC in FIG. 9 is referred to as a selected memory cell MCS1, and in this example, the selected memory cell MCS1 is located near the center of the memory cell array 11. The row selecting circuit 14 and the column selecting circuit 15 are configured to perform operations on the basis of the row and the column of the selected memory cell MCS, that is, on the basis of the selected word line WLS and the selected bit line BLS during data writing.

The local row switch (the selected local row switch) TLY1 connected to the selected word line WLS and the global row switch TGY1 are maintained in an on state during data writing. Therefore, the first node N1 of the selected memory cell MCS1 is connected to the first node S+ of the writing driver 161 via the selected word line WLS, the selected local row switch TLY1, the local word line LWL1, the global row switch TGY1, and the global word line GWL1. The current path between the first node S+ and the first node N1 of the selected memory cell MCS1 has a resistance value RX1.

The local column switch (the selected local column switch) TLX1 connected to the selected bit line BLS and the global column switch TGX1 are maintained in an on state during data writing. Therefore, the second node N2 of the selected memory cell MCS1 is connected to the second node S− of the writing driver 161 via the selected bit line BLS, the selected local column switch TLX1, the local bit line LBL1, the global column switch TGX1, and the global bit line GBL1. A current path between the second node N2 of the selected memory cell MCS1 and the second node S− has a resistance value RY1. A current path connecting the first node S+ and the second node S− is formed by the selected memory cell MCS1 being connected between the first node S+ and the second node S− of the writing driver 161. A current depicted as a thick solid line/arrow can flow through the current path by the writing driver 161 being enabled in the state in which the current path is formed. This current enables data to be written in the selected memory cell MCS1. The magnitude of the current depends on the data to be written, that is, which of AP writing and the P writing the writing corresponds to. The magnitude of the current to be supplied also depends on the position of the selected memory cell MCS1 in the memory cell array 11.

The local row switch (the selected local row switch) TLY2 connected to the selected word line WLS and the global row switch TLY2 are maintained in an on state during data writing. Therefore, the first node N1 of the selected memory cell MCS1 is also connected to the third node M+ of the writing driver 161 via the selected word line WLS, the selected local row switch TLY2, the local word line LWL2, the global row switch TGY2, and the global word line LWL2. As a result, the third node M+ receives a voltage V11 at the first node N1 of the selected memory cell MCS as illustrated by the dashed line.

The local column switch (the selected local column switch) TLX2 connected to the selected bit line BLS and the global row switch TGY2 are maintained in an on state during data writing. Therefore, the second node N2 of the selected memory cell MCS1 is also connected to the fourth node M− of the writing driver 161 via the selected bit line BLS, the selected local column switch TLX2, the local bit line LBL2, the global column switch TLX2, and the global bit line LBL2. As a result, as illustrated by the dashed line/arrow, the fourth node M− receives a voltage V12 at the second node N2 of the selected memory cell MC.

The state in which the selected memory cell MCS is electrically connected to the first node S+, the second node S−, the third node M+, and the fourth node M− of the writing driver 161 will be referred to as the magnetic storage device 1 being in a writing selected state with regard to the selected memory cell MCS.

As described above with reference to FIG. 6, the writing driver 161 outputs the output current IO (used as a writing current IW) with a magnitude that allows a voltage with substantially the same magnitude as that of the reference voltage Vref to be applied to both ends of the selected memory cell MCS1 regardless of the magnitudes of the voltage at the third node M+ and the voltage at the fourth node M−. The reference voltage Vref has a different magnitude in the case of AP writing and the P writing as described with reference to FIG. 7. The AP writing current Iwap flows through the selected memory cell MCS1 in the case of AP writing, and the P writing current Iwp flows through the selected memory cell MCS1 in the case of the P writing, using the reference voltage Vref with the magnitude based on the data to be written.

The magnitude of the resistance of the selected memory cell MCS1 after writing differs from the magnitude of the resistance of the selected memory cell MCS1 before writing due to completion of the data writing. Therefore, the voltages V11 and V22 immediately after the writing is completed, that is, immediately after the magnitude of the resistance is switched have different magnitudes from those of the voltages V11 and V12 before writing, respectively. However, the magnitude of the output current IO also changes based on the change in magnitudes of the voltages. As a result, the voltages applied to the selected memory cell MCS1 are substantially the same before and after writing.

Figure 10:
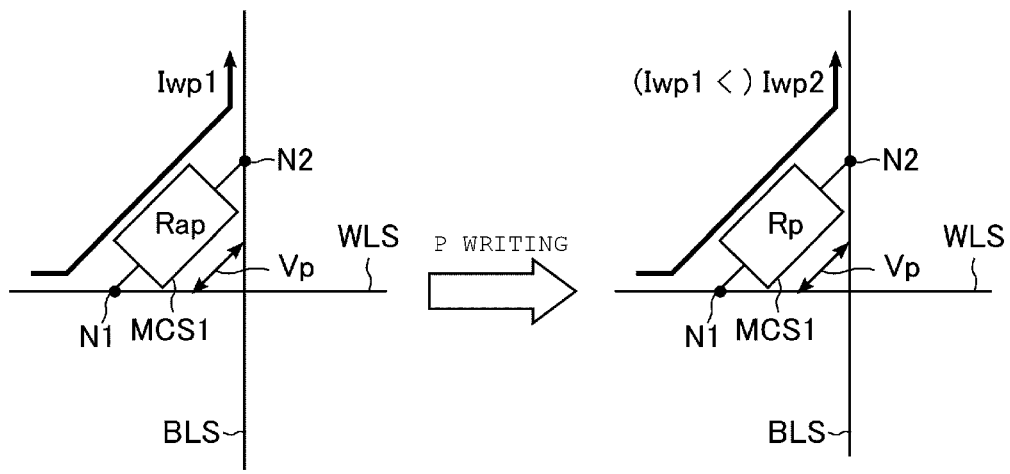
FIG. 10 depicts states of a selected memory cell before and after P writing according to a first embodiment.

FIG. 10 illustrates states of the selected memory cell MCS1 before and after P writing according to the first embodiment. Prior to P writing, the selected memory cell MCS1 has a resistance Rap in a high resistance state. For the P writing, the reference voltage Vref is set to have the magnitude equal to that of a voltage Vp (referred to as a P writing voltage Vp in some cases) intended to be applied to the selected memory cell MCS1 for the P writing. Based on the setting, the writing driver 161 outputs a P writing current Iwp1 with a magnitude obtained by dividing the P writing voltage Vp by the resistance Rap such that the P writing voltage Vp is applied to the selected memory cell MCS1 based on the voltage V11 at the first node N1 and the voltage V12 at the second node N2 of the selected memory cell MCS1.

The P writing is completed by the supply of the P writing current Iwp1, and the selected memory cell MCS1 is set to a resistance Rp. At the same time, the voltage V11 at the first node N1 and the voltage V12 at the second node of the selected memory cell MCS1 change. Based on the change, the writing driver 161 outputs the output current IO with the magnitude based on the changed voltage V11 and voltage V12. In other words, the writing driver 161 outputs a P writing current Iwp2 with a magnitude obtained by dividing the P writing voltage Vp by the resistance Rp. The P writing current Iwp2 is larger than the P writing current Iwp1. The P writing voltage Vp is continuously applied to the selected memory cell MCS1 even after the completion of the P writing by the P writing current Iwp2 flowing due to the completion of the P writing.

Figure 11:
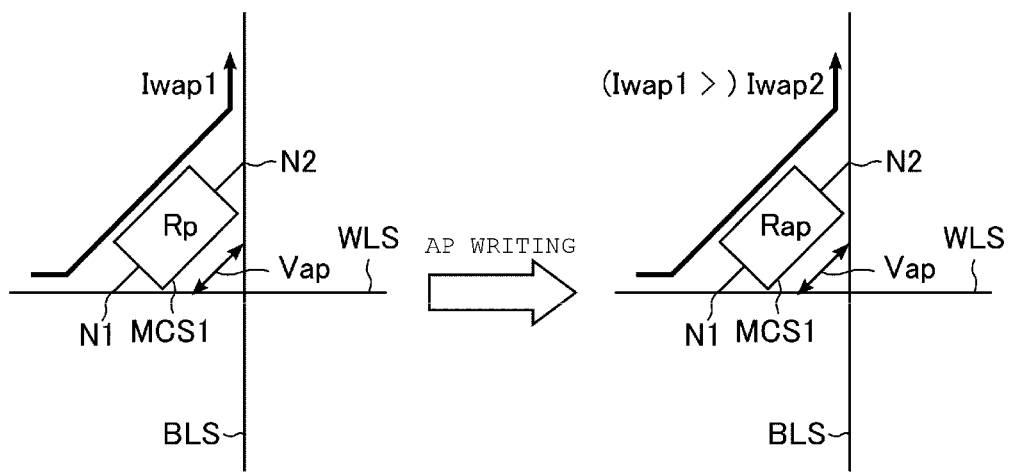
FIG. 11 depicts states of a selected memory cell before and after AP writing according to a first embodiment.

The same phenomenon occurs in regard to AP writing. FIG. 11 illustrates states of the selected memory cell MCS1 before and after AP writing according to the first embodiment. Prior to AP writing, the selected memory cell MCS1 has a resistance Rp in a low resistance state. For AP writing, the reference voltage Vref is set to have the magnitude that is equal to that of a voltage Vap (referred to as an AP writing voltage Vap in some cases) intended to be applied to the selected memory cell MCS1 for AP writing. Based on the setting, the writing driver 161 outputs an AP writing current Iwap1 with magnitude obtained by dividing the AP writing voltage Vap by the resistance Rp such that the AP writing voltage Vap is applied to the selected memory cell MCS1 based on the voltage V11 at the first node N1 and the voltage V12 at the second node N2 of the selected memory cell MCS1.

The AP writing is completed by the supply of the AP writing current Iwap1, and the selected memory cell MCS1 is set to the resistance Rap. At the same time, the voltage V11 at the first node N1 and the voltage V12 at the second node of the selected memory cell MCS1 change. Based on the change, the writing driver 161 outputs the output current IO with a magnitude based on the changed voltage V11 and voltage V12. In other words, the writing driver 161 outputs an AP writing current Iwap2 with a magnitude obtained by voltage dividing the AP writing voltage Vap with the resistance Rap. The AP writing current Iwap2 is smaller than the AP writing current Iwap1. The AP writing voltage Vap is continuously applied to the selected memory cell MCS1 even after the completion of the AP writing as the AP writing current Iwap2 flows due to the completion of the AP writing.

In this manner, the selected memory cell MCS receives voltages with substantially the same magnitudes before and after the change in magnitude of the resistance of the selected memory cell MCS.

The output current IO (that is, the writing current Iw) has a magnitude that allows substantially the same reference voltage Vref to be applied to the selected memory cell MCS regardless of the position of the selected memory cell MCS in the memory cell array 11 through the control performed by the writing driver 161.

The position of the selected memory cell MCS in the memory cell array 11 determines the resistance of the current path connecting the first node S+ and the second node S− of the writing driver 161 in the magnetic storage device 1 in the writing selected state. This is because the position of the selected memory cell MCS affects the route (routing) of the current path. In other words, the distance of the current path connecting the first node S+ and the first node N1 of a selected memory cell MCS and the distance of the current path connecting the second node N2 of the selected memory cell MCS and the second node S− depends on the position of the selected memory cell MCS. Also, the distances (lengths) of the current paths affect the resistance of the current paths. Therefore, the resistance of the current path connecting the first node S+ and the second node S− of the writing driver 161 depends on the position of the selected memory cell MCS. This means that the voltage at the first node N1 and the voltage at the second node N2 of the selected memory cell MCS also depend on the position of the selected memory cell MCS in the memory cell array 11.

In the writing selected state in FIG. 9, the writing driver 161 outputs an output current I01 with a certain magnitude set based on the voltage V11 at the first node N1 and the voltage V12 at the second node N2 of the selected memory cell MCS1.

Figure 12:
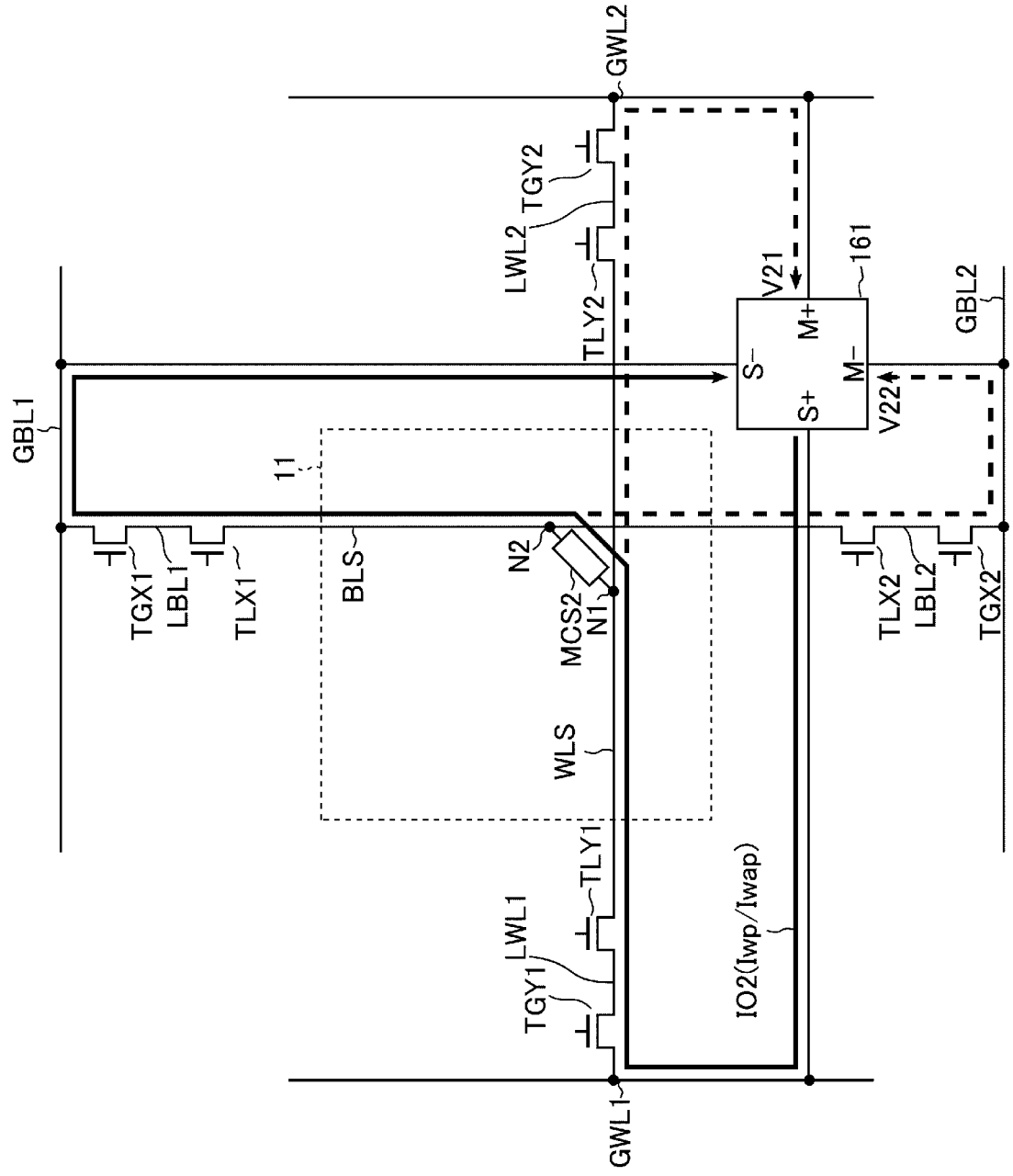
FIG. 12 depicts aspects during data writing in a magnetic storage device according to a first embodiment.
Figure 13:
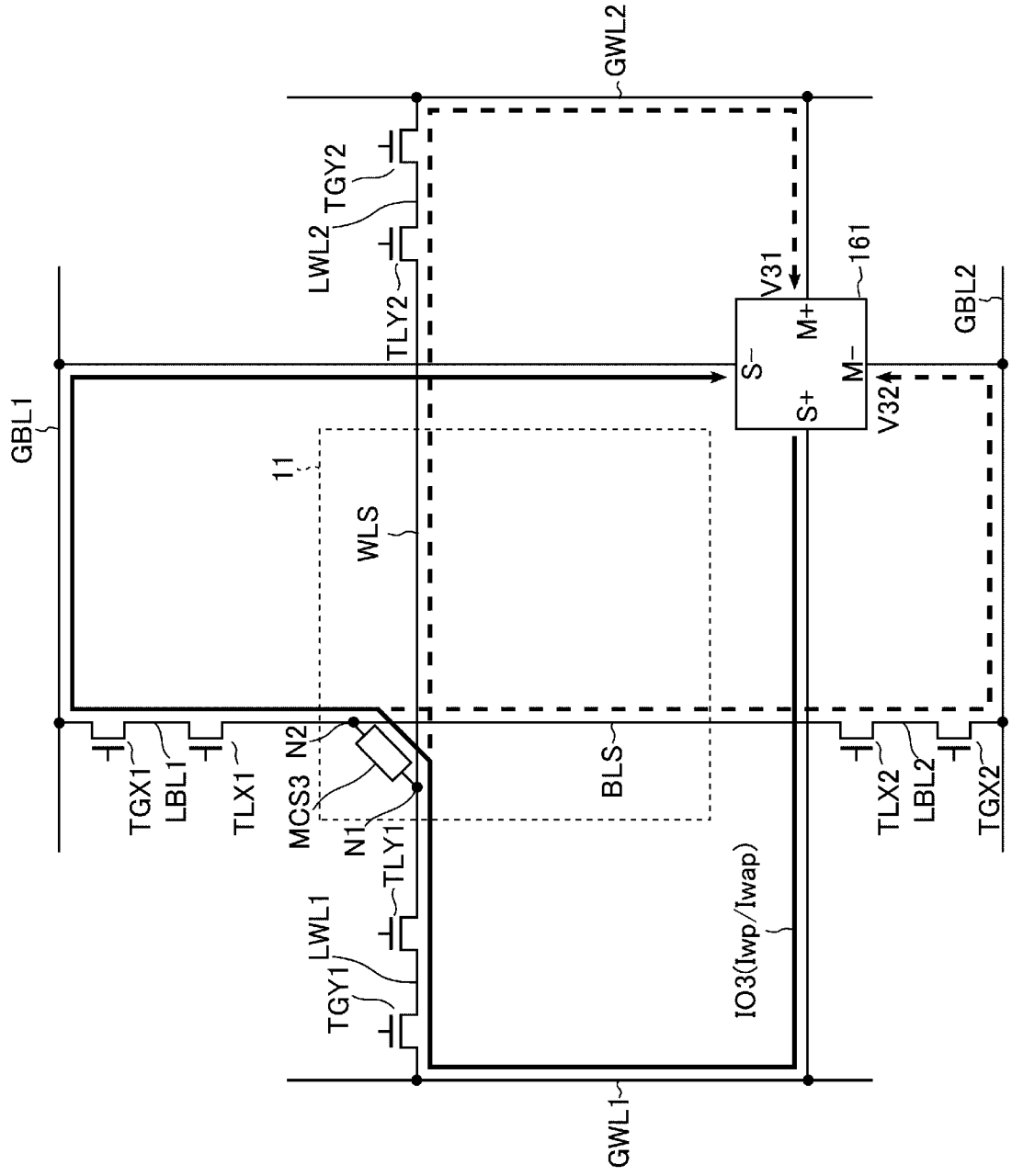
FIG. 13 depicts aspects during data writing in a magnetic storage device according to a first embodiment.

The position of the selected memory cell MCS in the memory cell array 11 affects the voltages at the first node N1 and the second node N2 of the selected memory cell MCS. FIGS. 12 and 13 illustrate states of the magnetic storage device 1 during data writing according to the first embodiment, similarly to FIG. 9; however, FIGS. 12 and 13 illustrate writing selected states of selected memory cells MCS2 and MCS3 that are at positions different from the selected memory cell MCS1 in FIG. 9.

As illustrated in FIG. 12, the selected memory cell MCS2 is located closer to the writing driver 161 than is the selected memory cell MCS1. In other words, the selected word line WLS in FIG. 12 is located closer to the local bit line LBL2 than is the selected word line WLS in FIG. 9. Moreover, the selected bit line BLS in FIG. 12 is located closer to the local word line LWL2 than is the selected bit line BLS in FIG. 9. The current path between the first node S+ and the first node N1 of the selected memory cell MCS2 has a resistance value RX2, and the current path between the second node N2 of the selected memory cell MCS2 and the second node S− has a resistance value RY2. The resistance value RX2 is less than the resistance value RX1 for the memory cell MCS1 illustrated in FIG. 9. Additionally, the resistance value RY2 is less than the resistance value RY1 for the memory cell MCS1e illustrated in FIG. 9. Thus, a voltage V21 at the first node N1 of the selected memory cell MCS2 is lower than the voltage V11 at the first node N1 of the selected memory cell MCS1. Additionally, the voltage V22 at the second node N2 of the selected memory cell MCS2 is lower than the voltage V12 at the first node N1 of the selected memory cell MCS1.

As described with reference to FIG. 6, the writing driver 161 outputs the output current IO with a magnitude adjusted such that the sum of the voltage at the fourth node M− and the reference voltage Vref is equal to the voltage at the third node M+. In the writing selected state illustrated in FIG. 12, the writing driver 161 thus outputs an output current I02. The output current I02 is smaller than the output current IO1 for the writing selected state illustrated in FIG. 9.

In the writing selected state illustrated in FIG. 12, the resistance value RX2 and the resistance value RY2 are both respectively lower than the resistance value RX1 and the resistance value RY1 for the writing selected state illustrated in FIG. 9. Therefore, the voltage set as defined by the output current IO1, the resistance value RX1, and the resistance value RY1 is substantially equal to the voltage set as defined by the output current I02, the resistance value RX2, and the resistance value RY2. In other words, the voltages are applied to both the selected memory cells MCS1 and MCS2 are each substantially equal to the reference voltage Vref.

As illustrated in FIG. 13, the selected memory cell MCS3 is located further from the writing driver 161 than is the selected memory cell MCS1 in the memory cell array 11. In other words, the selected word line WLS in FIG. 13 is located closer to the local bit line LBL1 than is the selected word line WLS in FIG. 9. Also, the selected bit line BLS in FIG. 13 is located closer to the local word line LWL1 than is the selected bit line BLS in FIG. 9. The current path between the first node S+ and the first node N1 of the selected memory cell MCS3 thus has a resistance value RX3, and the current path between the second node N2 of the selected memory cell MCS3 and the second node S− thus has a resistance value RY3. The resistance value RX3 is higher than the resistance value RX1, and the resistance value RY3 is higher than the resistance value RY1. A voltage V31 at the first node N1 of the selected memory cell MCS3 is higher than the voltage V11 at the first node N1 of the selected memory cell MCS1, and a voltage V32 at the second node N2 of the selected memory cell MCS3 is higher than the voltage V12 at the first node N1 of the selected memory cell MCS1.

In the writing selected state illustrated in FIG. 13, the writing driver 161 outputs an output current I03. The output current I03 is larger than the output current IO1 in the writing selected state illustrated in FIG. 9. In the writing selected state illustrated in FIG. 13, the resistance value RX3 and the resistance value RY3 are both respectively higher than the resistance value RX1 and the resistance value RY1 in the writing selected state illustrated in FIG. 9. Therefore, the voltage set as defined by the output current IO1, the resistance RX1, and the resistance RY1 is substantially equal to the voltage set as defined by the output current I03, the resistance RX3, and the resistance RY3. In other words, voltages that are substantially equal to the reference voltage Vref are applied to both the selected memory cells MCS1 and MCS3.

1.3. Advantages (Effects)

According to the first embodiment, the magnetic storage device 1 capable of curbing a data writing error while also curbing destruction of the memory cells MC is provided.

Figure 14:
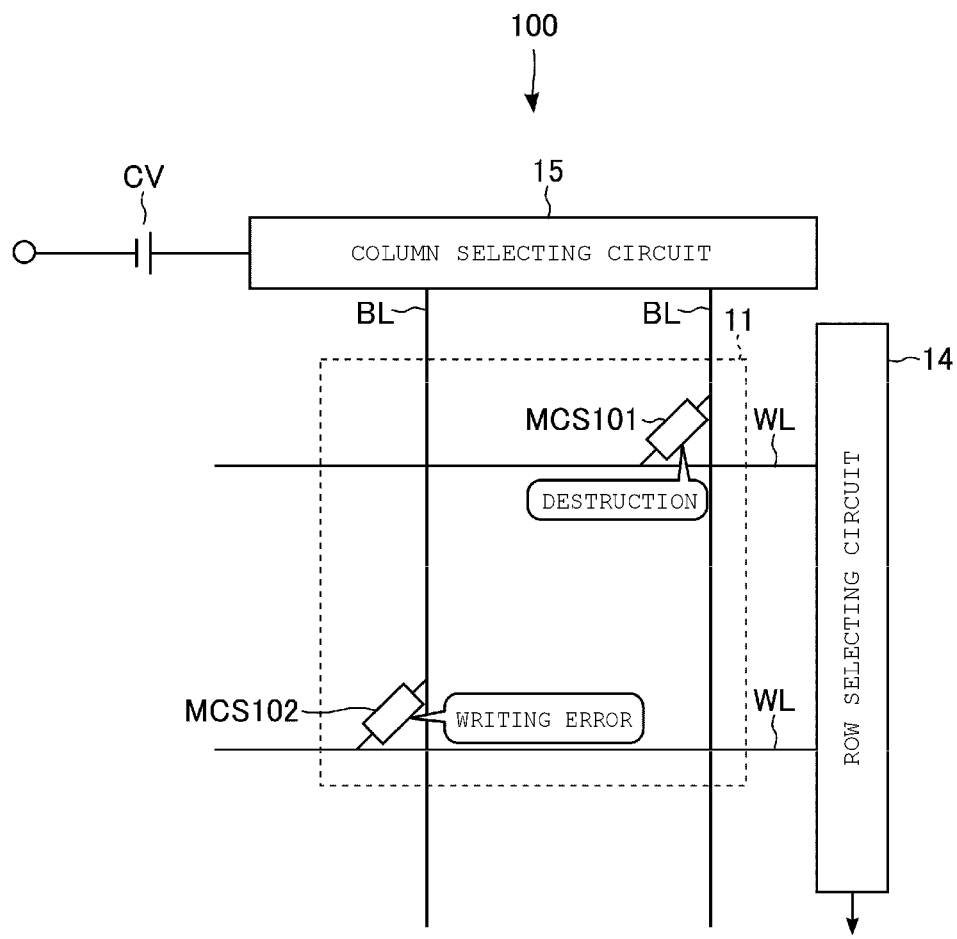
FIG. 14 depicts elements and connections of a first magnetic storage device for purposes of comparison.
Figure 15:
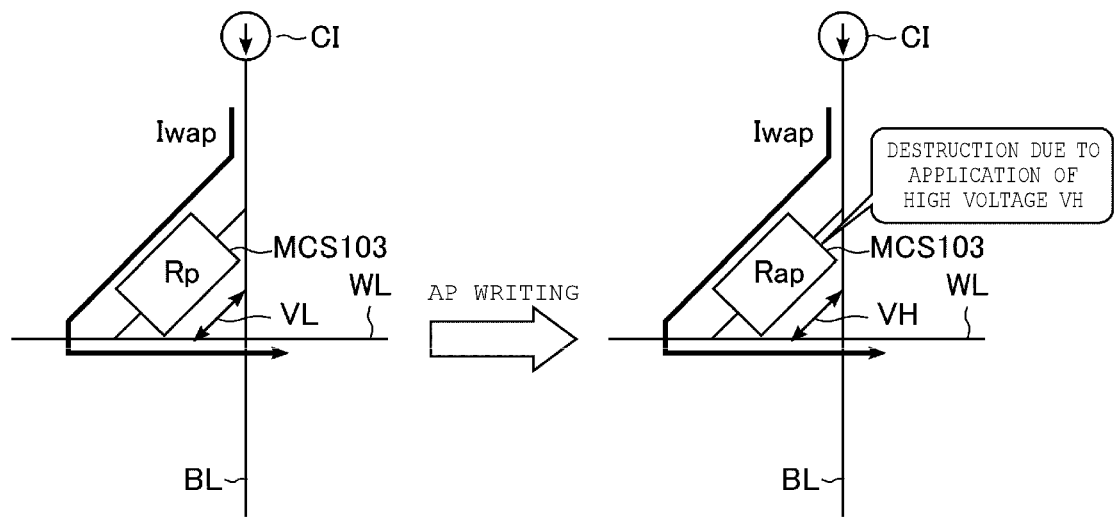
FIG. 15 illustrates a part of elements and connection of a second magnetic storage device for purposes of comparison.

The following two configurations are possible configurations for supplying a writing current to a memory cell array. FIG. 14 illustrates a part of elements and connection of a first magnetic storage device 100 for comparison purposes. FIG. 15 illustrates a part of elements and connection of a second magnetic storage device 200 for comparison purposes.

As illustrated in FIG. 14, the magnetic storage device 100 includes a memory cell array 11, a row selecting circuit 14, a column selecting circuit 15, and a writing circuit. The writing circuit includes a constant voltage source CV and supplies a voltage with a certain constant magnitude between the constant voltage source CV and a node of the ground potential.

A writing current flows from the constant voltage source CV to a node of the ground potential via the column selecting circuit 15, a word line WL (selected word line WLS), a selected memory cell MCS, a bit line BL (selected bit line BLS), and the row selecting circuit 14 by the constant voltage source CV applying a voltage, during data writing. When data is written in a selected memory cell MCS101 or MCS102 in the magnetic storage device 100, the following phenomena may occur. The selected memory cell MCS101 is located the closest to both the column selecting circuit 15 and the row selecting circuit 14 in the memory cells MC. The selected memory cell MCS102 is located the furthest from both the column selecting circuit 15 and the row selecting circuit 14 in the memory cells MC.

In the case of data writing in the selected memory cell MCS101, the current path from the constant voltage source CV to the selected memory cell MCS101 is short. Therefore, the total resistance in the current path is low. Thus, the magnitude of the writing current may become excessively large depending on the magnitude of the voltage supplied by the constant voltage source CV, and the selected memory cell MCS101 may be destroyed depending on the writing current.

In order to curb destruction of the memory cells MC due to such an excessively large writing current, curbing the magnitude at the constant voltage source CV is possible. However, in such a case, a data writing error in the selected memory cell MCS102 may occur. In other words, the current path from the constant voltage source CV to the selected memory cell MCS102 is long. Therefore, the total resistance in the current path is large. Thus, if the magnitude of the voltage supplied by the constant voltage source CV is kept small, a voltage with a sufficient magnitude might not be applied to the selected memory cell MCS102 and thus a writing current with the required magnitude does not flow through the selected memory cell MCS102. Data writing in the selected memory cell MCS102 may thus fail due to the insufficient magnitude of the writing current supplied thereto.

As illustrated in FIG. 15, the magnetic storage device 200 includes a memory cell array 11. The magnetic storage device 200 further includes a row selecting circuit 14 (see FIG. 14), a column selecting circuit 15 (see FIG. 14), and a writing circuit. The writing circuit includes a constant current source CI. The writing circuit of magnetic storage device 200 causes a current with a constant magnitude to flow from the constant current source CI to a node of a ground potential. In the case of AP writing, the writing circuit causes an AP writing current Iwap with the same magnitude as the constant current source CI to flow.

It is potentially possible to curb both the destruction of the memory cells MC and the failures of data writing based on utilization of a constant voltage source provided through utilization of the constant current source CI. However, the selected memory cell MCS103 may be destroyed due to the AP writing current Iwap with the same constant magnitude continuously flowing in the case of AP writing. Unintended variations in properties of the memory cells MC are inevitable, and individual memory cells MC may require slightly different lengths of time for which the AP writing current Iwap must be supplied before the AP writing is successfully completed. Therefore, in some instances, the AP writing current Iwap may still be caused to flow through the selected memory cell MCS103 even after the selected memory cell MCS103 has already been brought into the AP state due to the continued supply of the AP writing current Iwap even after the shifting to the AP state has already been achieved for the selected memory cell MSC103. The AP writing current Iwap is large, and the resistance Rap of the memory cells MC set to the AP state is also large. Therefore, if the AP writing current Iwap continues to flow through the selected memory cell MCS103 already shifted to the AP state, a voltage VH that is higher than a voltage VL applied to the selected memory cell MCS103 in the P state will be applied to both ends of the selected memory cell MCS103. In particular, the AP writing current Iwap will flow through those memory cells MC that are easily/quickly shifted to the AP state. The AP writing current IWap may flow through such memory cells MC for a relatively long period of time even after the completion of the shift to the AP state, and such memory cells MC are more likely to be destroyed due to application of the high voltage VH over a long period of time.

According to the first embodiment, the writing driver 161 receives, at the third node M+, the voltage at the first node N1 of the selected memory cell MC, receives, at the fourth node M−, the voltage at the second node N2, and supplies a current with a magnitude based on the voltage at the first node N1 and the voltage at the second node N2 of the selected memory cell MCS from the first node S+ to the selected memory cell MCS. To enable this, the magnetic storage device 1 includes the switches TLY1, TGY1, TLY2, TLY2, TLX1, TGX1, TLX2, and TGX2 and the wirings LWL2, GWL2, LBL2, and GBL2 for connecting the third node M+ and the fourth node M− of the writing driver 161 to the first node N1 and the second node N2 of the selected memory cell MCS, respectively.

With the aforementioned configuration, the writing current Iw with a magnitude based on the magnitude of the resistance of the selected memory cell MCS is supplied to the selected memory cell MCS by the writing current Iw with the magnitude based on the voltages at the first node N1 and the second node N2 of the selected memory cell MCS being supplied to the selected memory cell MCS first. This prevents the writing current Iw with the same magnitude as that before a change in magnitude of the resistance in the selected memory cell MCS due to writing of data in the selected memory cell MCS from flowing through the selected memory cell MCS even after the change. Therefore, a large voltage due to the current with the same magnitude as supplied before a change in magnitude of the resistance in the selected memory cell MCS and the resistance after the change in magnitude is prevented from being applied to the selected memory cell MCS. This curbs the destruction of the selected memory cell MCS.

Furthermore, writing current Iw with substantially the same magnitude can flow through the selected memory cell MCS regardless of the position of the selected memory cell MCS in the memory cell array 11 based on the same principle. This is because the resistance of the element that connects the first node N1 of the selected memory cell MCS and the writing driver 161 and the resistance of the element that connects the second node N2 of the selected memory cell MCS and the writing driver 161 depend on the position of the selected memory cell MCS, and the writing current Iw depends on the voltage at the first node N1 and the voltage at the second node N2 of the selected memory cell MCS. The AP writing current Iwap with substantially the same magnitude flows through the selected memory cell MCS in the case of AP writing, and the P writing current Iwp with substantially the same magnitude flows through the selected memory cell MCS in the case of P writing, regardless of the position of the selected memory cell MCS. Therefore, the writing error is prevented from occurring due to the insufficient writing current Iw caused by the position of the selected memory cell MCS.

It is thus possible to curb both the destruction of the memory cells MC and a data writing failure that may occur in the magnetic storage device 100 due to supply of the constant voltage and the destruction of the selected memory cell MCS that may occur in the magnetic storage device 200 due to supply of the constant current. In other words, it is possible to provide a magnetic storage device 1 capable of curbing both destruction of the memory cells MC and a data writing failure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic storage device, comprising:
   a magnetoresistive element having a first end and a second end;
   a first switch between the first end and a first wiring;
   a second switch between the second end and a second wiring;
   a third switch between the first end and a third wiring;
   a fourth switch between the second end and a fourth wiring; and
   a driver connected to the first wiring and the second wiring and configured to supply a current at a magnitude set based on a voltage at the first end and a voltage at the second end to the first wiring.

2. The magnetic storage device according to claim 1, further comprising:
   a fifth wiring connected to the first end and connected between the first switch and the third switch; and
   a sixth wiring connected to the second end and connected between the second switch and the fourth switch.

3. The magnetic storage device according to claim 2, wherein
   the fifth wiring is connected to the first switch at a third end and is connected to the third switch at a fourth end, and
   the sixth wiring is connected to the second switch at a fifth end and is connected to the fourth switch at a sixth end.

4. The magnetic storage device according to claim 1, wherein
   the driver includes a first node connected to the first end via the first switch and a second node connected to the second end via the second switch, and
   the driver is configured to output the current from the first node and draw the current at the second node.

5. The magnetic storage device according to claim 4, wherein the driver includes a third node connected to the first end via the third switch and a fourth node connected to the second end via the fourth switch.

6. The magnetic storage device according to claim 4, wherein
   the driver is configured to receive a reference voltage, and
   the magnitude of the current is based on a sum of the voltage at the second end and the reference voltage and the voltage at the first end.

7. The magnetic storage device according to claim 4, wherein
   the driver includes an operational amplifier, and
   the operational amplifier is configured to receive, at a non-inverting input terminal, the voltage at the first end and, at an inverting input terminal, a voltage equal to a sum of the voltage at the second end and a reference voltage.

8. The magnetic storage device according to claim 7, wherein
   the driver includes a first transistor,
   the first transistor is connected to the first node, and
   a gate of the first transistor receives an output of the operational amplifier.

9. A magnetic storage device, comprising:
   a magnetoresistive element having a first end and a second end;
   an operational amplifier having a non-inverting input terminal connected to the first end and an inverting input terminal receiving a voltage equal to a sum of a reference voltage and a voltage at the second end; and
   a first transistor connected between the first end and a first node at a first potential, a gate of the first transistor receiving an output of the operational amplifier.

10. The magnetic storage device according to claim 9, further comprising:
    a second transistor connected between the second end and a second node at a second potential that is lower than the first potential.

11. The magnetic storage device according to claim 10, further comprising:
    a first wiring connected to the first end;
    a first switch connected between the first wiring and the first transistor; and
    a second wiring connected to the second end, wherein
    the second transistor is connected between the second wiring and the second node.

12. The magnetic storage device according to claim 11, further comprising:
    a third switch connected between the first wiring and the non-inverting input terminal; and
    a capacitor connected between the second wiring and the inverting input terminal.

13. A magnetic storage device, comprising:
    a magnetoresistive element having a first end and a second end; and
    a driver having a first node connected to the first end and a second node connected to the second end, the driver configured to supply, from the first node, a current of a magnitude set based on a voltage at the first end and a voltage at the second end and to draw the current at the second node.

14. The magnetic storage device according to claim 13, wherein
    the driver includes a third node connected to the first end and a fourth node connected to the second end, and
    the driver is configured to supply, from the first node, the current of the magnitude set based on a voltage at the first node and a voltage at the second node.

15. The magnetic storage device according to claim 14, wherein the driver is configured to:
    receive a reference voltage, and
    supply, from the first node, the current of a magnitude based on a sum of the voltage at the fourth node and the reference voltage and the voltage at the third node.

16. The magnetic storage device according to claim 15, wherein
    the driver includes an operational amplifier, and
    the operational amplifier receives, at a non-inverting input terminal, the voltage of the fourth node, and, at an inverting input terminal, a voltage equal to a sum of the voltage at the third node and the reference voltage.

17. The magnetic storage device according to claim 16, wherein
    the driver includes a first transistor,
    the first transistor is connected to the first node, and
    a gate of the first transistor receives an output of the operational amplifier.

18. The magnetic storage device according to claim 17, further comprising:
    a first switch between the first end and a first wiring;
    a second switch between the second end and a second wiring;
    a third switch between the first end and a third wiring; and
    a fourth switch between the second end and a fourth wiring.

19. The magnetic storage device according to claim 18, further comprising:
- a fifth wiring connected to the first end and connected between the first switch and the third switch; and
- a sixth wiring connected to the second end and connected between the second switch and the fourth switch.

20. The magnetic storage device according to claim 19, wherein
- the fifth wiring is connected to the first switch at a third end and to the third switch at a fourth end, and
- the sixth wiring is connected to the second switch at a seventh end and to the fourth switch at an eighth end.

* * * * *